United States Patent [19]
Chang et al.

[11] Patent Number: 5,691,939
[45] Date of Patent: Nov. 25, 1997

[54] TRIPLE POLY PMOS FLASH MEMORY CELL

[75] Inventors: Shang-De Ted Chang, Fremont; Jayson Trinh, Milpitas, both of Calif.

[73] Assignee: Programmable Microelectronics Corporation, San Jose, Calif.

[21] Appl. No.: 568,835

[22] Filed: Dec. 7, 1995

[51] Int. Cl.$^6$ ................................................. G11C 11/34
[52] U.S. Cl. ........................... 365/165.18; 315/185.19; 257/316
[58] Field of Search ................ 365/185.14, 185.18, 365/185.19, 185.27; 257/315, 316

[56] References Cited

U.S. PATENT DOCUMENTS

| | | | |
|---|---|---|---|
| 4,462,090 | 7/1984 | Iizuka | 365/185.05 |
| 4,661,833 | 4/1987 | Mizutani | 365/185.18 |
| 4,959,812 | 9/1990 | Momodomic et al. | 365/185.17 |
| 5,280,446 | 1/1994 | Ma et al. | 365/185.15 |

*Primary Examiner*—Joseph A. Popek
*Attorney, Agent, or Firm*—Skjerven, Morrill, MacPherson, Franklin & Friel

[57] ABSTRACT

A P-channel MOS memory cell has P+ source and drain regions formed in an N-well. A thin tunnel oxide is provided between the well surface and an overlying floating gate. In one embodiment, the thin tunnel oxide extends over a substantial portion of the active region and the device. An overlying control gate is insulated from the floating gate by a first insulating layer. An overlying select gate is insulated from the control gate by an insulating layer. The select gate includes an elongated extension portion for preventing over-programming of the circuit. The device is programmed via hot electron injection from the drain end of the channel region to the floating gate, without avalanche breakdown, which allows the cell to be bit-selectable during programming. Erasing is accomplished by electron tunneling from the floating gate to the N-well with the source, drain, and N-well regions equally biased. Since there is no high drain/well junction bias voltage, the channel length of the cell may be reduced without incurring any destructive junction stress.

8 Claims, 6 Drawing Sheets

TRIPLE POLY PMOS FLASH MEMORY CELL

CROSS-REFERENCE TO RELATED APPLICATIONS

This application is related to the U.S. patent application Ser. No. 08/557,514 entitled "A PMOS Flash Memory Cell Capable of Multi-level Threshold Voltage Storage", U.S. patent application Ser. No. 557,442 entitled "Non-volatile Electrically Erasable Memory with PMOS Transistors NAND Gate Structure", now U.S. Pat. No. 5,581,504, and U.S. patent application Ser. No. 08/560,249 entitled "PMOS Flash EEPROM Cell with Single Poly", all filed on Nov. 14, 1995.

FIELD OF THE INVENTION

This invention relates generally to non-volatile memory devices and specifically to very high density and high speed non-volatile memory devices.

BACKGROUND OF THE INVENTION

Early semiconductor memories employed P-channel floating-gate avalanche-injection MOS (FAMOS) devices. These devices are programmed by applying a 35 volt reverse bias across the N-well/drain junction such that high energy electrons generated by avalanche breakdown are injected from the depletion layer to the floating gate. The floating gate is typically erased, i.e., discharged, using UV radiation. In addition to having relatively slow operating speeds, the large reverse bias required for avalanche programming undesirably necessitates the on-chip generation of high voltages and also limits the extent to which the device size may be minimized.

As NMOS technology improved, manufacturers were able to take advantage of the faster intrinsic mobility of electrons, as compared with that of holes, and began fabricating N-channel memory devices such as EPROMs and EEPROMs which were faster and required lower programming voltages than FAMOS cells.

A floating gate EPROM cell, such as the ETOX Flash EPROM cell manufactured by Intel Corporation of Santa Clara, Calif., is charged by the injection of hot electrons from the N-channel/N+ drain junction region without an avalanche breakdown of the junction. Such programming may be realized, for instance, by applying 12 volts to the control gate and 7 volts to the drain while grounding the source region. This electrical bias causes electrons to accelerate across the channel region toward the drain. The high energy electrons created near the N-channel/N+ drain junction by the resulting impact ionization are attracted by the more positive control gate voltage and are injected into the floating gate.

Erasing is typically accomplished via electron tunneling by applying 12 volts to the source while grounding the control gate. Programming via hot carrier injection allows such an EPROM cell to be bit-programmable and therefore eliminates the need for a select transistor. However, charging the floating gate via hot electron injection from the N-channel/N+ drain region requires high programming currents and, therefore, results in high power consumption.

Further, the ETOX Flash EPROM cell described above suffers from read disturb and may have long term reliability problems as a result of high N+ source/P− substrate junction voltages during erasing. Moreover, erasing via band to band tunneling from the floating gate to the N+ source/P− substrate junction results in a high erase current, thereby consuming an undesirable amount of power during erasing.

The floating gate of a typical EEPROM memory cell is charged by the tunneling of electrons through a thin oxide layer insulating the floating gate from the drain. For instance, such an EEPROM cell may be erased by applying 20 volts to the control gate while the source, drain, and substrate are grounded. The resultant electric field causes electrons to tunnel through the oxide layer from the drain to the floating gate. Programming, i.e., discharging the floating gate, may be accomplished by holding the control gate at ground while applying 20 volts to the drain, thereby reversing the electric field and pulling electrons from the floating gate to the drain.

The EEPROM cell suffers from several drawbacks. First, in order to facilitate electron tunneling, a tunnel window must be opened in a region of the gate oxide proximate to the drain. This tunnel opening not only increases the size of the storage cell but also increases fabrication complexity and cost. Second, each EEPROM cell requires its own select transistor in order to be bit addressable during programming and reading. Further, such EEPROM cells require relatively high programming and erasing voltages of approximately 20 volts. The application of such high programming and erasing voltages across P/N junctions within the EEPROM cell undesirably limits the amount by which the cell size may be reduced.

SUMMARY OF THE INVENTION

A non-volatile semiconductor memory cell is disclosed herein which overcomes problems in the art discussed above. In accordance with the present invention, a P-channel MOS transistor has P+ source and P+ drain regions formed in an N-type well which is formed in a P− substrate. A thin tunnel oxide is provided between the N-well surface and an overlying floating gate. In one embodiment, the thin tunnel oxide extends over a substantial portion of the active region of the device. An overlying control gate is insulated from the floating gate by a first insulating layer. An overlying select gate is insulated from the control gate by a second insulating layer and overlaps the source region of the transistor.

The P-channel device is programmed via hot electron injection from the drain end of the channel region to the floating gate. This programming mechanism allows the cell to be bit-programmable using a low programming current and a low programming voltage. Erasing is accomplished by electron tunneling from the floating gate to the N-well, to the source, and to the drain with the N-well, source, and drain equally biased. Since there are no high drain/well junction bias voltages utilized in erasing modes, the channel length of the cell may be reduced without incurring junction breakdown and destructive junction stress. The absence of such high P/N junction voltages allows the size of such cells to be minimized. Further, the equal bias voltage applied to the N-well, source, and drain allows the cell to be bit-selectable during erasing.

The P-channel memory cell in accordance with the present invention can be operated in deep depletion mode after it is programmed, thereby allowing for a higher read current and thus a faster operating speed. Further, voltage of the floating gate, coupled from the control gate, drain, N-well and source, is always lower than the voltage of the drain, N-well or the source. Accordingly, the problem associated with read disturb of cell will not occur.

DESCRIPTION OF THE INVENTION

The present invention relates to an improvement in a flash memory cell. The following description is presented to enable one of ordinary skill in the art to make and use the invention. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
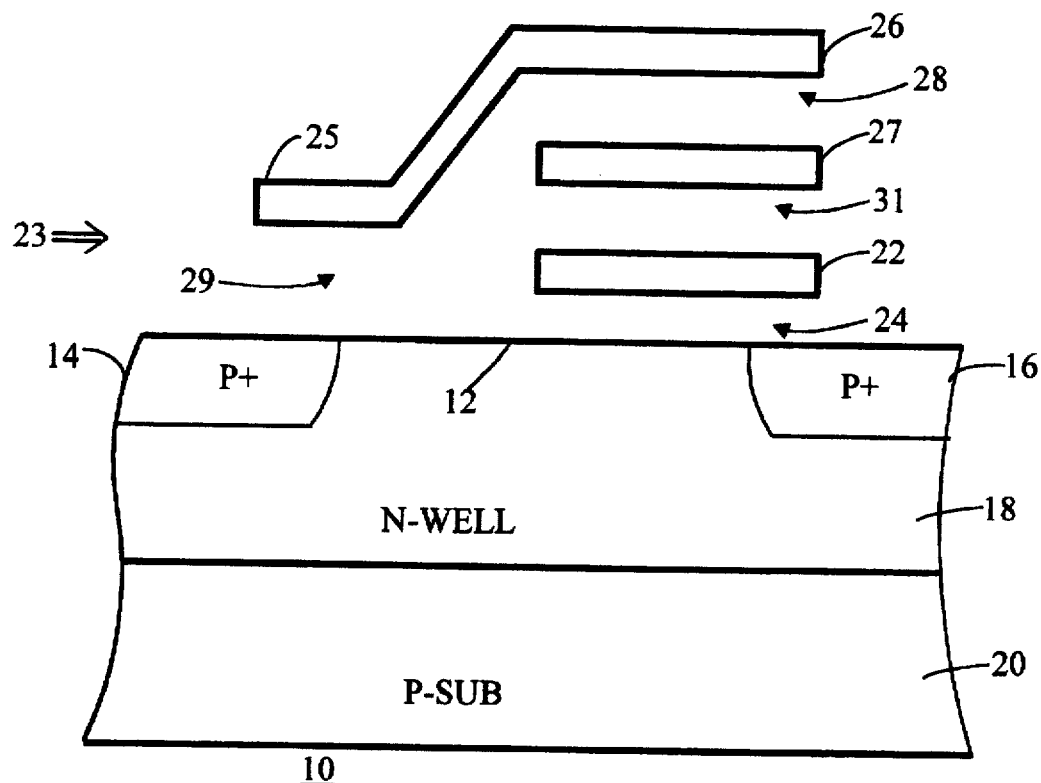
FIG. 1 is a cross-sectional view of a memory cell in accordance with the present invention.

Referring to FIG. 1, a flash memory cell 10 has a channel 12 extending between P+ source 14 and P+ drain 16 regions formed in an N− well 18 of a P-substrate 20. Note that although shown in FIG. 1 as being formed in N− well 18, the flash memory cell 10, in other embodiments, may be formed in any other suitable underlying N− type structure. A floating gate 22 is insulated from the surface of N− well 18 by a thin tunneling oxide layer 24. In the preferred embodiment shown in FIG. 1, tunneling oxide layer 24 has a thickness of approximately 80–100 Å and extends over the entire length of floating gate 22 and a portion of P+ drain 16. It is to be understood, however, that in other embodiments tunneling oxide layer 24 may be of other varying lengths, length being in the direction indicated by arrow 23. For instance, in one embodiment (not shown), tunneling oxide layer 24 extends only over a portion of P+ drain 16, wherein the remaining surface of N− well 18 has a thick gate oxide layer formed thereon. A control gate 27 is insulated from floating gate 22 by a first interpoly dielectric 31 having a thickness of approximately 180–350 Å (oxide equivalent). The control gate 27 controls programming and erasing of the cell 10.

A select gate 26 is insulated from control gate 27 by a second interpoly dielectric 28 having a thickness of approximately >400 Å (oxide equivalent). The select gate 26 includes an elongated tail portion 25 which extends partially over the P+ source 14 in which a gate oxide portion 29 has a thickness of between 120 Å and 300 Å as will be described later. This tail portion 25 allows for isolation of overprogramming of the cell from the bit line which is coupled to the drain 16 of the cell 10. In the preferred embodiment, the flash memory cell 10 should, in its normal or erased state, have a threshold voltage $V_T$ equal to approximately −1.0 to −5.0 V depending upon the particular cell and the configuration of its associated array. The particular value of $V_T$ may be altered by conventional ion implanting of dopants into channel region 12.

Figure 2:
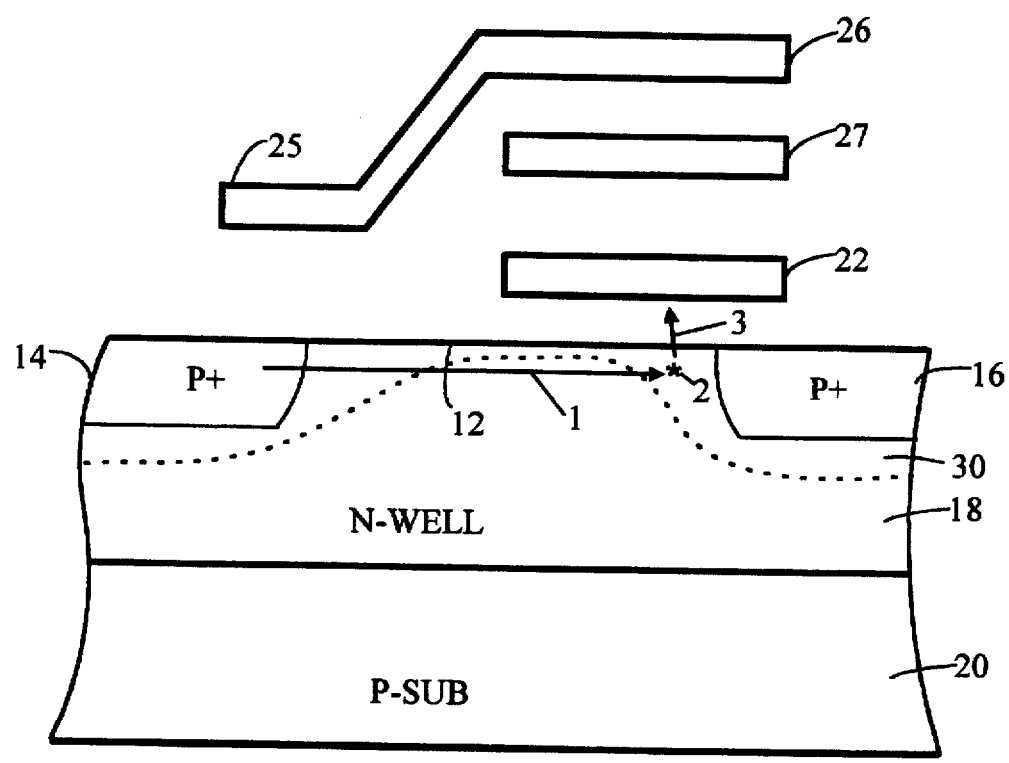
FIG. 2 is a cross-sectional view of a portion of the cell illustrating programming of the cell.

The operation of the flash memory cell 10 is as follows. To program the flash memory cell 10, the voltage at P+ source 14 and at N− well 18 is between 5V to 15V while the voltage at drain 16 is held at 0V. The voltage at select gate 26 is held between approximately 0 to 15 V while the voltage at control gate 27 is ramped up from 0 to approximately 15 V. Acceptable ranges for these programming voltages are listed below in Table 1. Now referring also to FIG. 2, positively charged holes near source 14 and channel 12 are attracted to the less positive voltage on P+ drain 16 and are accelerated through channel region 12 towards P+ drain 16, as indicated by arrow 1. These holes collide with electrons and lattice atoms in a drain depletion region 30, thereby resulting in impact ionization, as indicated by star 2. The high energy electrons generated from impact ionization, attracted by the positive electrical field from floating gate 22 due to the positive voltages on control gate 27 and select gate 26, are injected from depletion region 30 into floating gate 22, as indicated by arrow 3. The resultant negative charge on floating gate 22 depletes the channel region 12 and forces the flash memory cell 10 into inversion. In the preferred embodiment, the flash memory cell 10 has, in its programmed state, a $V_T$ equal to approximately 4 V. The elongated portion 25 prevents overprogramming of cells by placing a bias voltage across the oxide portion. The programming voltages mentioned above and listed in Table 1, by effecting such a low channel current PMOS hot electron injection (LCCPHEI) programming, allow the flash memory cell 10 to be bit-selectable during programming.

Figure 3:
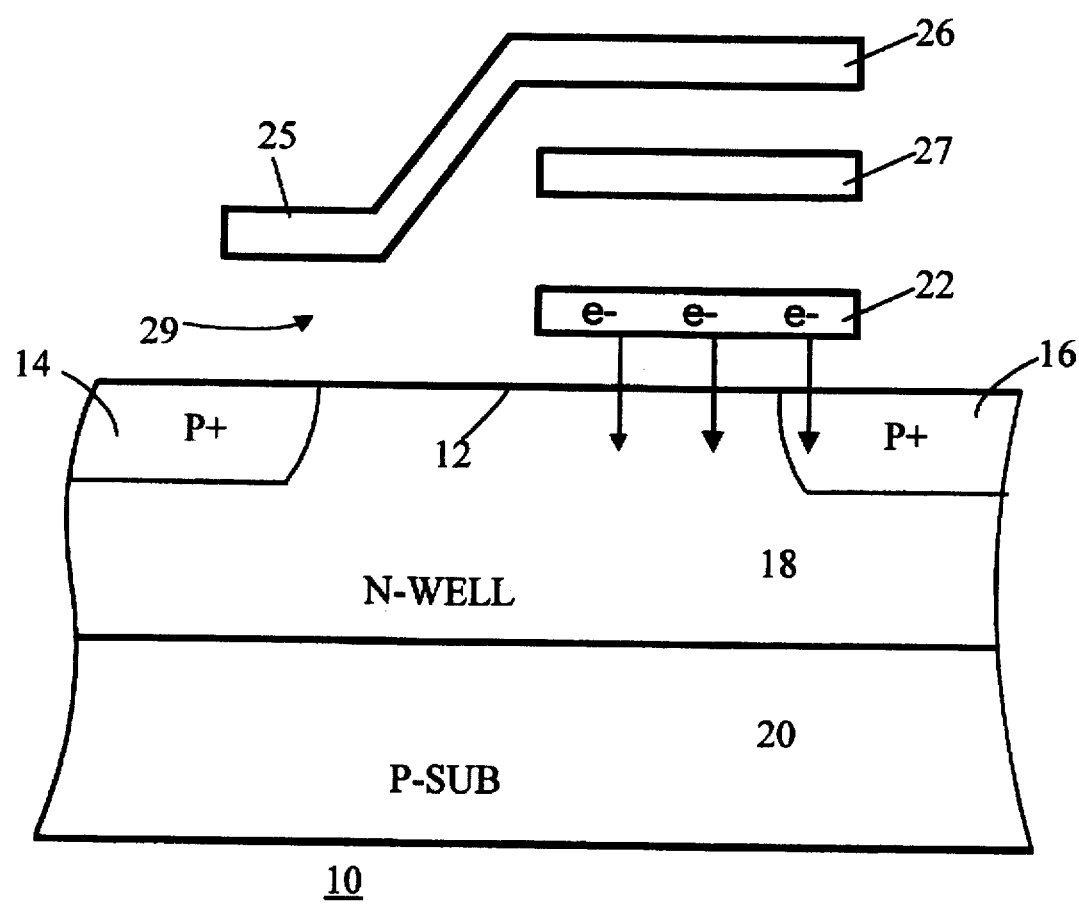
FIG. 3 is a cross-sectional view illustrating reading of the cell.
Figure 4:
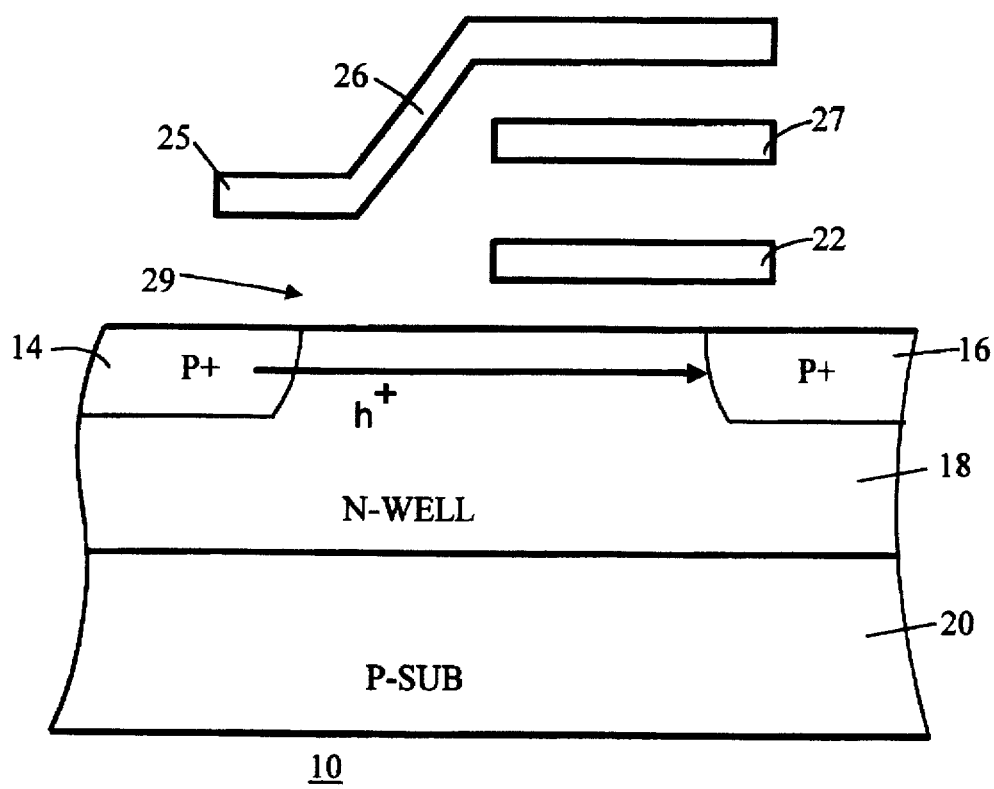
FIG. 4 is a cross-sectional view illustrating reading of the cell.

In this embodiment, the flash memory cell 10 may be erased, as shown in FIG. 3, by applying approximately 8 volts to P+ source 14, P+ drain 16, and N− well 18 and applying approximately −8 volts to control gate 27 and approximately 0 volts to select gate 26. Acceptable ranges for such voltages are listed below in Table 1 as "Erase" 1. The application of the erase voltages, which results in an erasing of the flash memory cell 10 in such a manner, allows erasing voltages of only 8 volts to be used without any degradation in performance of the flash memory cell 10. In this manner, the flash memory cell 10 allows for High Endurance Selectable Channel (HESC) erasing.

Where it is desired to read the flash memory cell 10, $V_{cc}$ is applied as a read voltage to source 14 and N− well 18 in FIG. 4. A voltage between 0 and $V_{cc}$, depending upon the associated array configuration, is applied to control gate 27. A voltage less than $V_{cc}$ is applied to P+ drain 16. The flash memory cell 10 will conduct a channel current only if the flash memory cell 10 is programmed, i.e., only if charge is stored in floating gate 22. Thus, the voltage on floating gate 22 will be lower than the voltage on P+ source 14, P+ drain 16, and N-well 18. Further, when the flash memory cell 10 is in a programmed state, the voltage on floating gate 22 remains lower than the voltage on P+ source 14, P+ drain 16, and N-well 18. As a result, the flash memory cell 10 does not suffer from read disturb problems characteristic of conventional NMOS memory devices. The above-described operation is summarized in Table 1:

TABLE 1

|  | Source | Control | Select | Drain | Well |
|---|---|---|---|---|---|
| Program | 5V to 15V | 0V to 15V | 0V to 15V | 0V to 2V | 5V to 15V |
| Erase 1 | 3V to 15V | −3V to −15V | 0V to Vcc | 3V to 15V | 3V to 15V |
| Erase 2 | 15V – 22V | 0V | 0V | 15V – 22V | 15V – 22V |
| Read | Vcc | 0V to Vcc | 0V to Vcc −1V | 0V to Vcc −2V | Vcc |

The above-described operation of flash memory cell 10 utilizes PMOS characteristics to achieve numerous other advantages over conventional semiconductor memory cells. The characteristic hot electron injection efficiency for P-channel devices is approximately 1000 times that of N-channel devices. Thus, unlike conventional NMOS memory cells which typically require approximately a 0.5 milli-amp programming current to generate enough gate current to charge the floating gate, the flash memory cell 10 requires a programming current of only a few micro-Amps. Requiring a programming current two orders of magnitude smaller than that of conventional NMOS memory cells such as EPROMs not only allows the flash memory cell 10 to reduce power consumption during programming but also allows for page writing, i.e., to simultaneously write to numerous ones of cells 10 in a row of an associated memory array (not shown).

It is known that the channel of conventional NMOS flash memory cells must be of a sufficient length to tolerate the typically high reverse bias voltage across the P-well/N+ drain junction (as well as the resultant high electric field) required during erasing via electron tunneling. As a result, it is difficult to further reduce the size of such conventional cells without incurring destructive junction stress which, in turn, may lead to reliability problems. Since, however, the operation of the flash memory cell 10 neither requires nor utilizes such high junction biases during erasing (see Table 1), minimizing the channel length of the flash memory cell 10 is not so limited. This feature allows the flash memory cell 10 to be fabricated using 0.25 μm technology. Avoiding such high junction biases during erasing also advantageously results in a more durable and reliable memory cell.

Note that as the channel length of an NMOS transistor falls below approximately 0.7 μm, electron mobility saturates. In PMOS devices, however, hole mobility continues to increase as the channel length decreases below 0.7 μm and becomes comparable to electron mobility as the gate length is further decreased. Accordingly, minimizing the channel length of the flash memory cell 10 also advantageously results in a hole mobility comparable to that of electrons, thereby increasing the speed of the flash memory cell 10. Further, note that when the channel of programmed flash memory cell 10 is inverted in deep depletion a higher read current and thus faster read speeds result.

Figure 5:
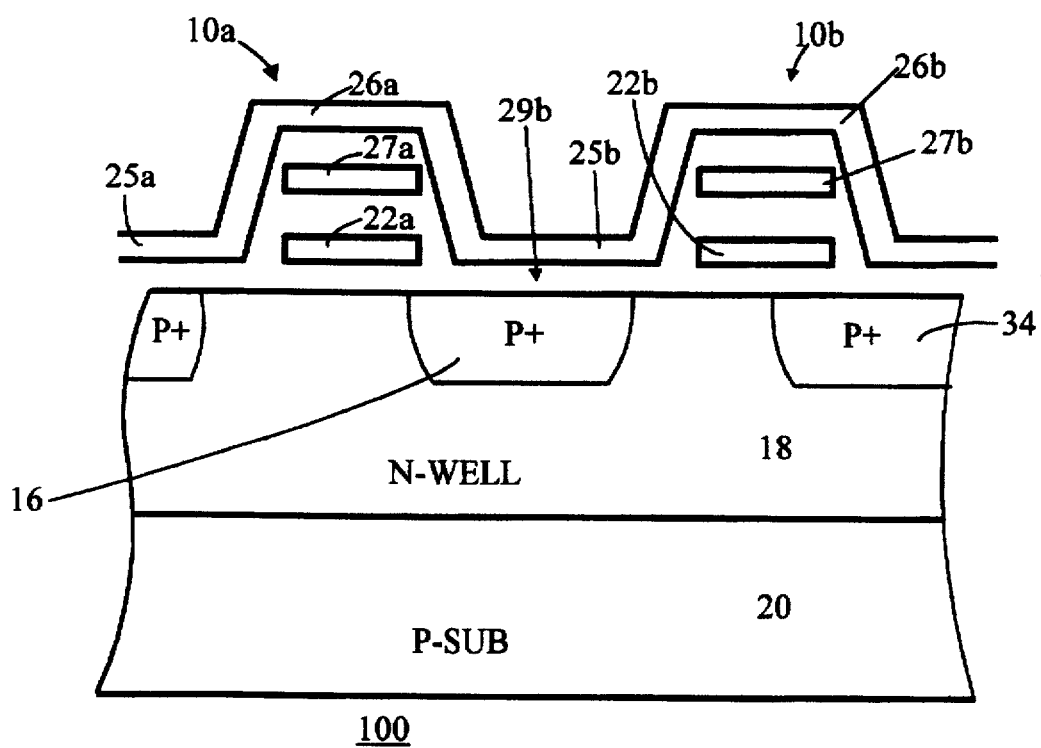
FIGS. 5 and 6 show side and top cross-sectional views of a transistor memory cell including two flash memory cells.
Figure 6:
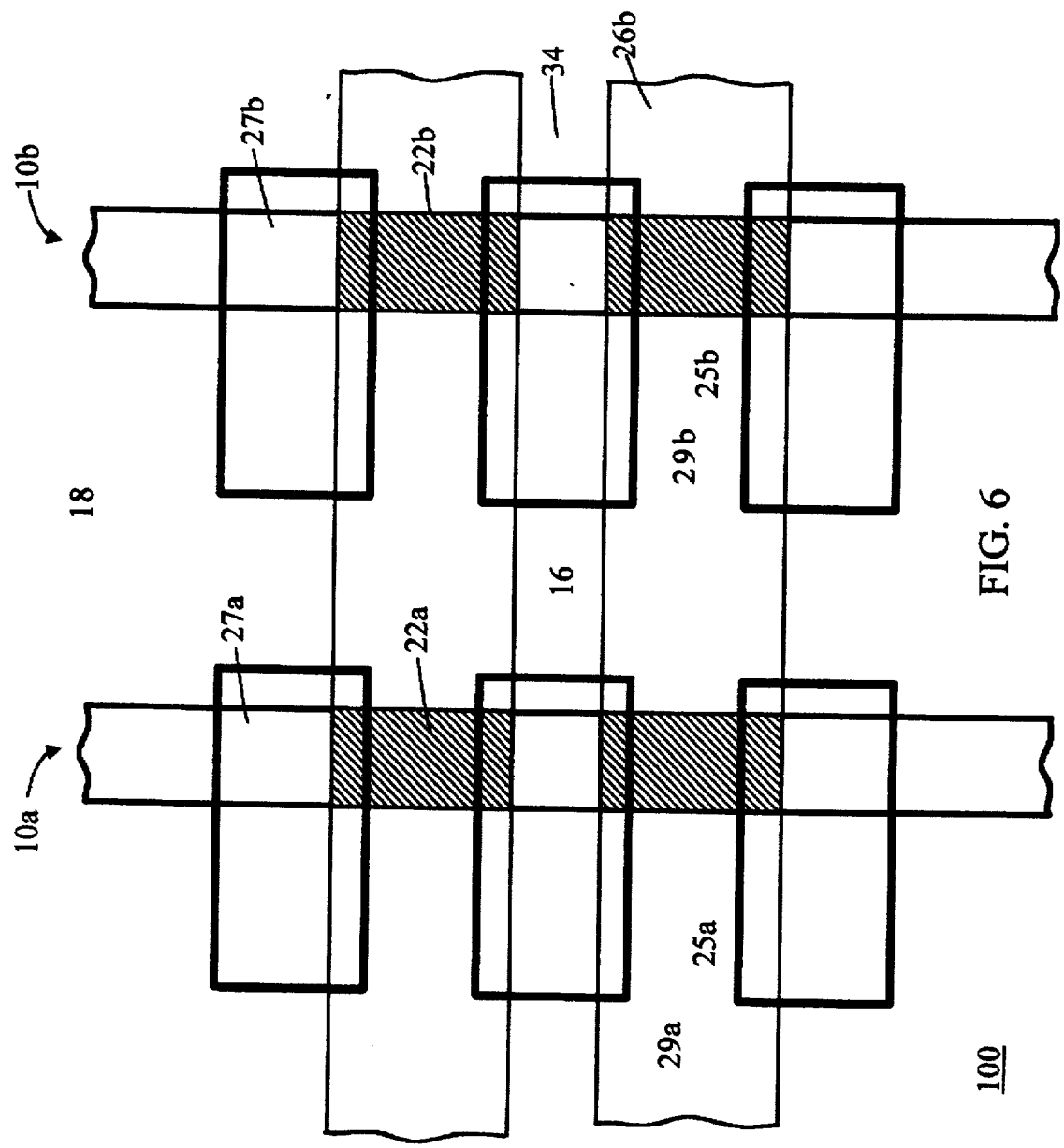

The above described embodiments may be employed as part of a compact memory array. FIGS. 5 and 6 show a side cross-sectional view and a top view, respectively of the transistor memory cell 100 including two flash memory cells 10a and 10b. Similar elements for the cells are labeled with numbers similar to that of cell 10 described above. The descriptions for these elements can be referenced with respect to cell 10 and are therefore omitted in the following descriptions for simplicity. Flash memory cell 10 includes a P+ source 16 (which also serves as drain 16 for the other flash memory cell 10a) and a P+ drain 34 formed in N-well 18. Through this arrangement, a P+ region 16 can be utilized as both a drain and source for adjoining flash memory cells, thereby providing for a more compact array structure.

Figure 7:
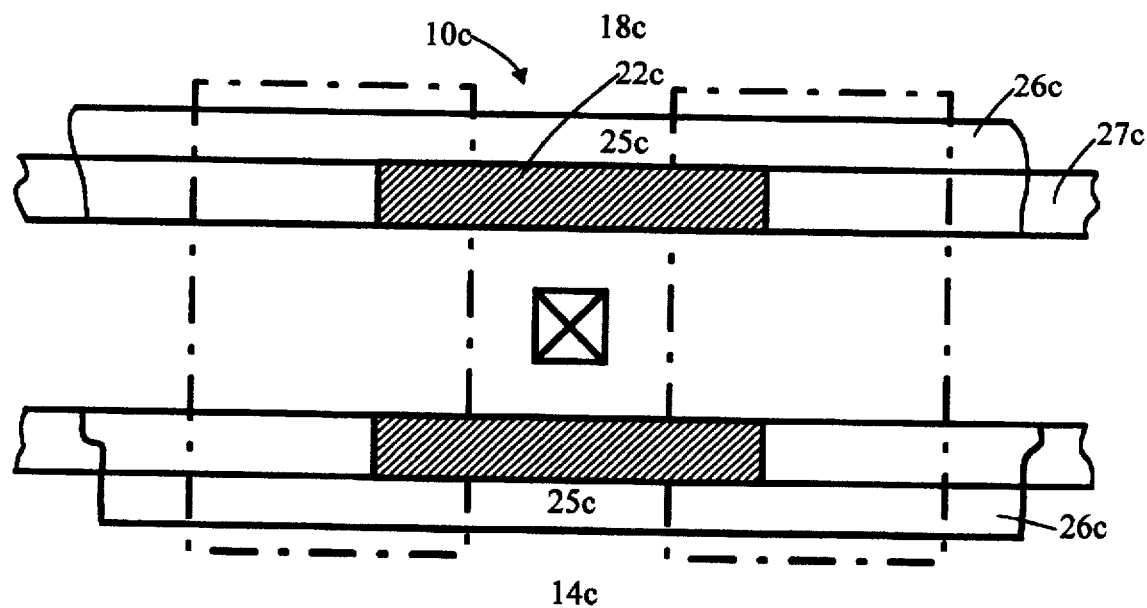
FIGS. 7 and 8 show top views of two opposite mirror image cell array architectures.
Figure 7:
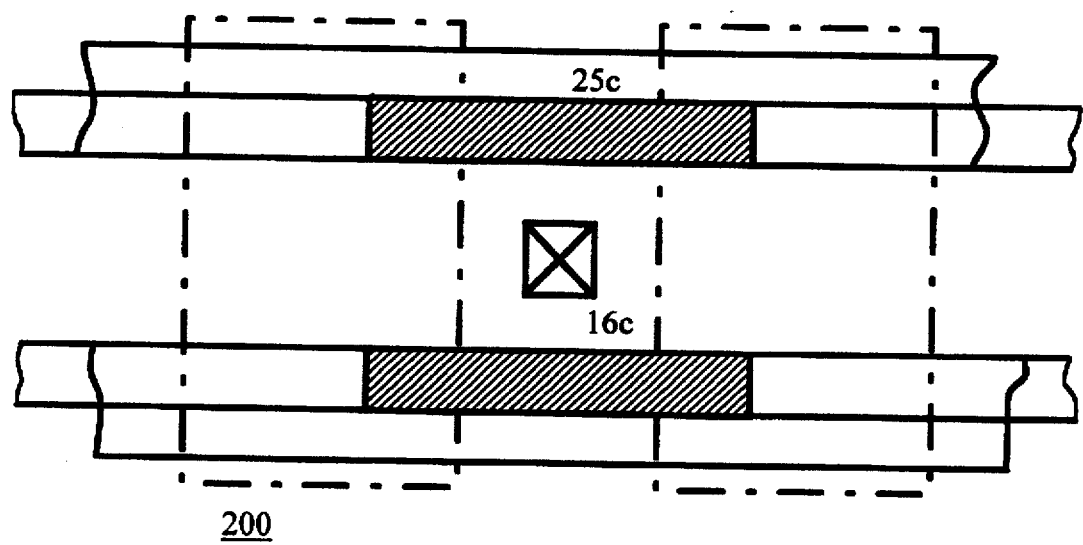
Figure 8:
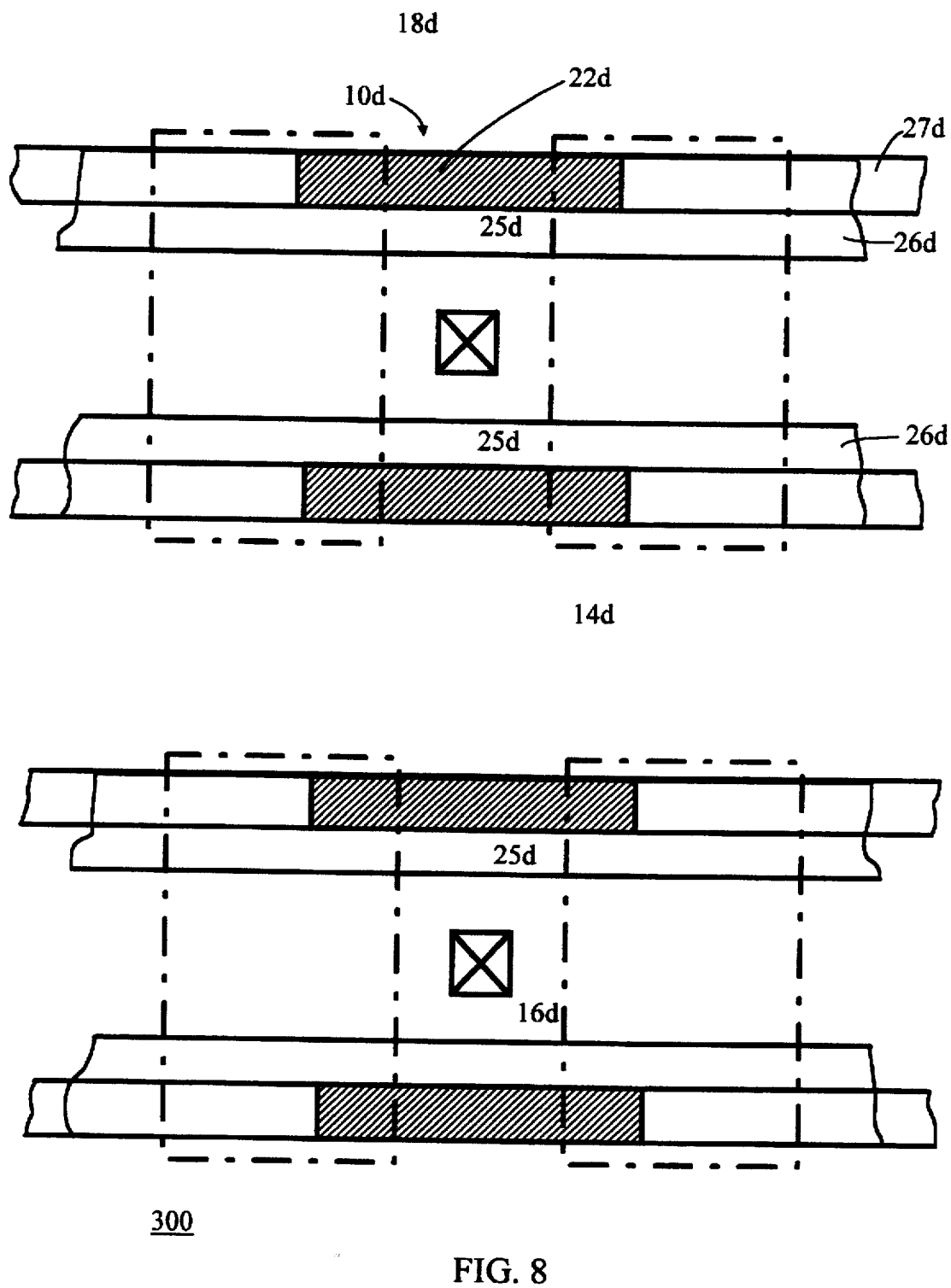

FIGS. 7 and 8 show top views of two opposite mirror image cell array architectures 200 and 300, respectively. The extension portion 25c of the select gate 26c of array 200 is pointed in the opposite direction of extension portion 25d of select gate 26d of cell array 300.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A semiconductor memory cell comprising:
   an N-type well region having formed therein a P+ source, a P+ drain, and a channel region extending between said source and said drain;
   a first insulating layer overlying said well region;
   a floating gate overlying said first insulating layer;
   a second insulating layer overlying said floating gate;
   a control gate overlying the second insulating layer;
   a third insulating layer overlying the control gate; and
   a select gate overlying said third insulating layer, the select gate including an elongated portion which extends over the source preventing overprogramming of the cell, the control gate for controlling the programming and erasing of the cell wherein during programming of said cell holes are accelerated across said channel region and collide with electrons in a depletion region of said drain to result in the generation of hot electrons via impact ionization, said hot electrons being injected into said floating gate of said cell and thereby negatively charging said floating gate.

2. The structure of claim 1 wherein said cell is erased by the tunneling of electrons from said floating gate to said channel region, said source, and said drain.

3. The structure of claim 1 wherein there is no charge in the floating gate and the threshold voltage is between −1.5v to −6v.

4. The structure of claim 1 wherein the threshold voltage of the cell is adjusted by implanting the channel with phosphorus or arsenic.

5. A method of programming a floating gate P-channel memory cell having a P+ source and a P+ drain formed in an N-type well, said method comprising the steps of:
   applying a first bias voltage to said source and said N-type well of said cell; applying a second bias voltage to said drain;
   applying a third bias voltage to a select gate;
   applying a fourth bias voltage to a control gate of said cell to accelerate holes across said channel region so as to collide with electrons in a depletion region of said drain and thereby result in the generation of hot electrons via impact ionization, said hot electrons being injected into said floating gate of said cell and thereby negatively charging said floating gate.

6. The method of claim 5 wherein said first bias voltage is between approximately 5 and 15 volts, said second bias voltage is between approximately 0 and 2 volts, said third bias voltage is between approximately 0 and 15 volts and the fourth bias voltage is approximately 15 volts.

7. The method of claim 5 wherein said first bias voltage is between approximately 5 and 15 volts, said second bias voltage is between approximately 0 and 2 volts, the third bias voltage is between 0 and 15 volts and said fourth bias is a ramped voltage increasing from approximately 0 volts to approximately 15 volts.

8. The method of claim 5 in which the threshold voltage of the cell after programming is in the range of −2 to 6 volts.

* * * * *